(12) United States Patent
Kim et al.

(10) Patent No.: US 11,037,760 B2
(45) Date of Patent: Jun. 15, 2021

(54) TEMPERATURE CONTROLLER, TEMPERATURE MEASURER, AND PLASMA PROCESSING APPARATUS INCLUDING THE SAME

(71) Applicant: SAMSUNG ELECTRONICS CO., LTD., Suwon-si (KR)

(72) Inventors: Hak-Young Kim, Bucheon-si (KR); Bi-Ah Shin, Anyang-si (KR); Bo-Ra Yoon, Goyang-si (KR); Jun-Ho Im, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 112 days.

(21) Appl. No.: 16/226,786

(22) Filed: Dec. 20, 2018

(65) Prior Publication Data

US 2019/0385813 A1 Dec. 19, 2019

(30) Foreign Application Priority Data

Jun. 18, 2018 (KR) .................. 10-2018-0069371

(51) Int. Cl.
*C23C 16/00* (2006.01)
*H01L 21/306* (2006.01)
(Continued)

(52) U.S. Cl.
CPC .......... *H01J 37/3211* (2013.01); *F28F 3/048* (2013.01); *G01K 1/143* (2013.01);
(Continued)

(58) Field of Classification Search
CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32522; H01J 37/32321;
(Continued)

(56) References Cited

U.S. PATENT DOCUMENTS 5,446,824 A * 8/1995 Moslehi ............ H01L 21/67115
   118/50.1
5,571,366 A * 11/1996 Ishii .................. H01J 37/32082
   156/345.26
(Continued)

FOREIGN PATENT DOCUMENTS

JP 2008-235161 A 10/2008
JP 5657953 B2 1/2015
KR 10-0884327 B1 2/2009

*Primary Examiner* — Luz L Alejandro Mulero
(74) *Attorney, Agent, or Firm* — Lee IP Law, P.C.

(57) ABSTRACT

A temperature controller of a plasma processing apparatus, a temperature measurer for a plasma processing apparatus, and a plasma processing apparatus, the temperature controller including a movable cooling plate configured to selectively contact a dielectric window in a plasma chamber, the cooling plate having at least one cooling groove through which a cooling agent for cooling the dielectric window is flowable; at least one cooling port including a cooling passageway that is connected to the at least one cooling groove; and a resilient member configured to resiliently press the cooling port toward the cooling plate such that the cooling plate is relatively movable with respect to the dielectric window.

12 Claims, 5 Drawing Sheets

(51) Int. Cl.
*H01J 37/32* (2006.01)
*F28F 3/04* (2006.01)
*G01K 1/143* (2021.01)

(52) U.S. Cl.
CPC ... *H01J 37/32119* (2013.01); *H01J 37/32522* (2013.01); *H01J 2237/2001* (2013.01)

(58) Field of Classification Search
CPC .......... H01J 37/32348; H01J 37/32357; H01J 37/32192; H01J 37/32201; H01J 37/32211; H01J 37/3222; H01J 37/32229; H01J 37/32238; H01J 37/32247; H01J 37/32256; H01J 37/32266; H01J 37/32275; H01J 37/32284; H01J 37/32293; H01J 37/32302; H01J 37/32311; H05H 2001/4652; H05H 2001/466; H05H 2001/4667; H05H 1/46; H05H 2001/4607; H05H 2001/4615; H05H 2001/4622; H05H 2001/463; H05H 2001/4637; H05H 2001/4645; H01L 21/67248

See application file for complete search history.

(56) References Cited

U.S. PATENT DOCUMENTS

| | | | |
|---|---|---|---|
| 5,863,376 A | 1/1999 | Wicker et al. | |
| 6,048,798 A | 4/2000 | Gadgil et al. | |
| 6,095,083 A * | 8/2000 | Rice | H01J 37/32706 118/715 |
| 6,916,399 B1 * | 7/2005 | Rozenzon | H01J 37/321 118/715 |
| 9,417,138 B2 | 8/2016 | Krampert et al. | |
| 2009/0218045 A1 | 9/2009 | Hiroshima et al. | |
| 2013/0228283 A1 * | 9/2013 | McChesney | H01J 37/32082 156/345.27 |
| 2014/0083615 A1 | 3/2014 | Kim et al. | |
| 2016/0104604 A1 | 4/2016 | Kim et al. | |

* cited by examiner

TEMPERATURE CONTROLLER, TEMPERATURE MEASURER, AND PLASMA PROCESSING APPARATUS INCLUDING THE SAME

CROSS-REFERENCE TO RELATED APPLICATION

Korean Patent Application No. 10-2018-0069371, filed on Jun. 18, 2018, in the Korean Intellectual Property Office, and entitled: "Temperature Control Unit, Temperature Measurement Unit, and Plasma Processing Apparatus Including the Same," is incorporated by reference herein in its entirety.

BACKGROUND

1. Field

Embodiments relate to a temperature controller, a temperature measurer, and a plasma processing apparatus including the same.

2. Description of the Related Art

A plasma processing apparatus may be classified into a capacitively coupled plasma (CCP) apparatus and an inductively coupled plasma (ICP) apparatus.

In the CCP apparatus, an RF power may be applied to opposite chucks to generate an RF electric field between the chucks. Plasma may be generated from a process gas injected from a dielectric window using the electric field.

In the ICP apparatus, plasma may be generated from a process gas injected from a gas nozzle using an electromagnetic field induced by a coil antenna. An RF power applied to the coil antenna may be transmitted to the process gas through a dielectric window.

SUMMARY

The embodiments may be realized by providing a temperature controller for a plasma processing apparatus, the temperature controller including a movable cooling plate configured to selectively contact a dielectric window in a plasma chamber, the cooling plate having at least one cooling groove through which a cooling agent for cooling the dielectric window is flowable; at least one cooling port including a cooling passageway that is connected to the at least one cooling groove; and a resilient member configured to resiliently press the cooling port toward the cooling plate such that the cooling plate is relatively movable with respect to the dielectric window.

The embodiments may be realized by providing a temperature measurer for a plasma processing apparatus, the temperature measurer including a thermocouple configured to selectively contact a dielectric window in a plasma chamber and to measure the temperature of the dielectric window; and a housing surrounding the thermocouple and preventing contact between the thermocouple and a cooling agent for cooling the dielectric window.

The embodiments may be realized by providing a plasma processing apparatus including a plasma chamber; a chuck in the plasma chamber and on which a substrate is receivable; an antenna at upper region in the plasma chamber, the antenna being configured to induce an electromagnetic field between the chuck and the antenna; a dielectric window between the antenna and the chuck; a movable cooling plate configured to selectively contact the dielectric window, the cooling plate having at least one cooling groove through which a cooling agent for cooling the dielectric window is flowable; at least one cooling port including a cooling passageway that is connected to the at least one cooling groove; and a resilient member configured to resiliently press the cooling port toward the cooling plate such that the cooling plate is relatively movable with respect to the dielectric window.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
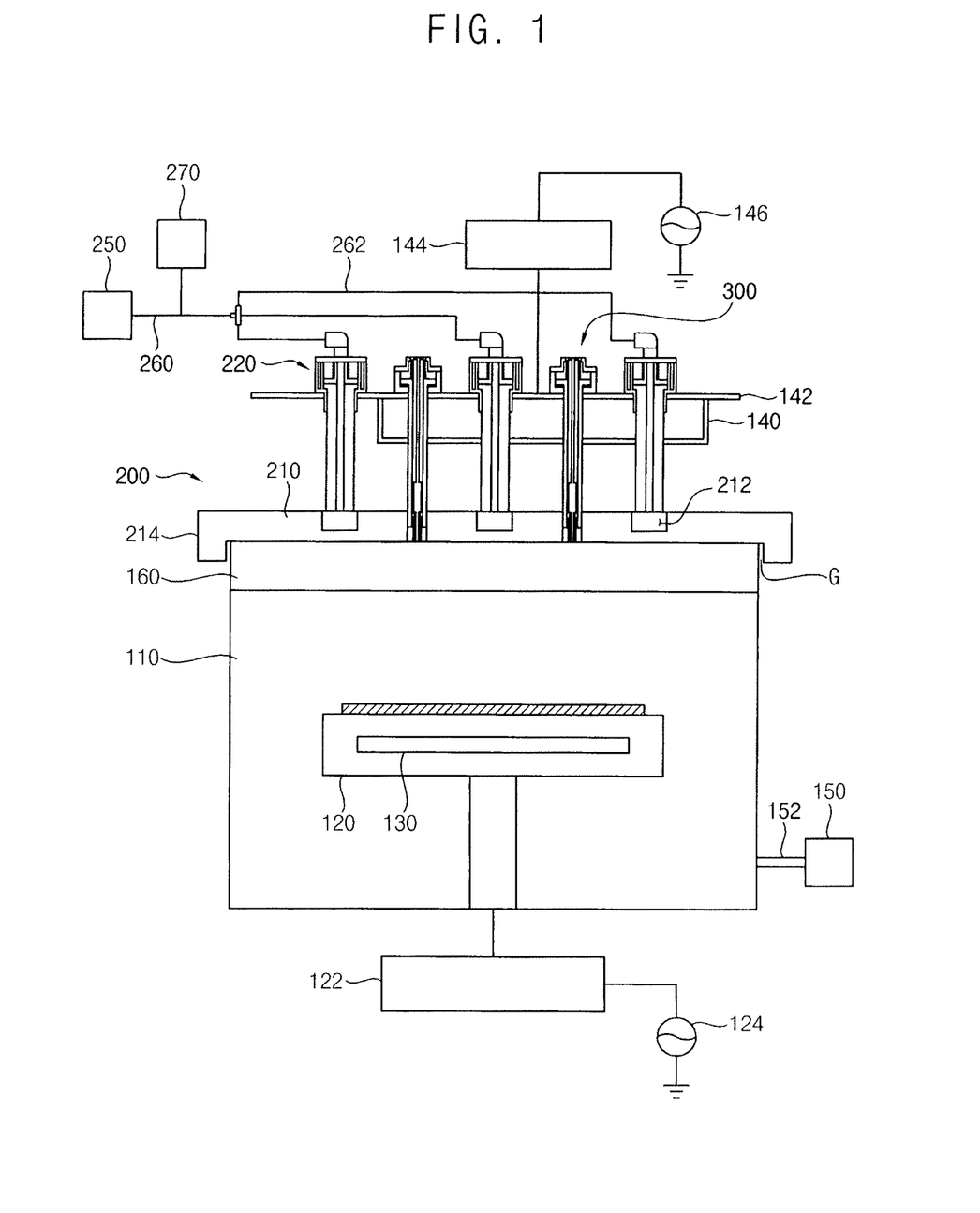
FIG. 1 illustrates a cross-sectional view of a plasma processing apparatus in accordance with example embodiments.

FIG. 1 illustrates a cross-sectional view of a plasma processing apparatus in accordance with example embodiments.

Referring to FIG. 1, a plasma processing apparatus of an example embodiment may include a plasma chamber 110, a chuck 120, an antenna 140, a dielectric window 160, a temperature control unit or temperature controller 200 and a temperature measurement unit or temperature measurer 300.

In an implementation, the plasma processing apparatus may form a layer on a substrate or etch a layer on a substrate using inductively coupled plasma (ICP). For example, the plasma processing apparatus may include the dielectric window 160. The substrate may include a semiconductor substrate, a glass substrate, etc.

An exhaust pump 150 may be connected with the plasma chamber 110 through an exhaust line 152. The exhaust pump 150 may exhaust byproducts in the plasma chamber 110.

The chuck 120 may be arranged on or adjacent to a bottom surface of the plasma chamber 110. The chuck 120 may support the semiconductor substrate. The semiconductor substrate may be positioned on an upper surface of the chuck 120. The chuck 120 may be connected with an RF power 124 through a matcher 122. In an implementation, a heater 130 for heating the semiconductor substrate may be arranged in the chuck 120. In an implementation, the chuck 120 may be or include an electrostatic chuck (ESC).

The antenna 140 may be arranged at or on an upper region in the plasma chamber 110. The antenna 140 may be fixed to an antenna ground plate 142. The antenna 140 may be electrically connected with an RF power 146 through a matcher 144. An electromagnetic field induced by the antenna 140 may be applied to a process gas injected into the plasma chamber 110 to generate plasma. In an implementation, the antenna 140 may have a coil shape.

The dielectric window 160 may be arranged under the antenna 140. The dielectric window 160 may include a dielectric material. For example, the dielectric window 160 may include aluminum oxide ($Al_2O_3$). The dielectric window 160 may facilitate transfer of the RF power in the antenna 140 into the plasma chamber 110. In an implementation, the dielectric window 160 may facilitate injection of the process gas into the plasma chamber 110. For example, the dielectric window 160 may perform functions substantially the same as those of a showerhead of a substrate processing apparatus.

Figure 2:
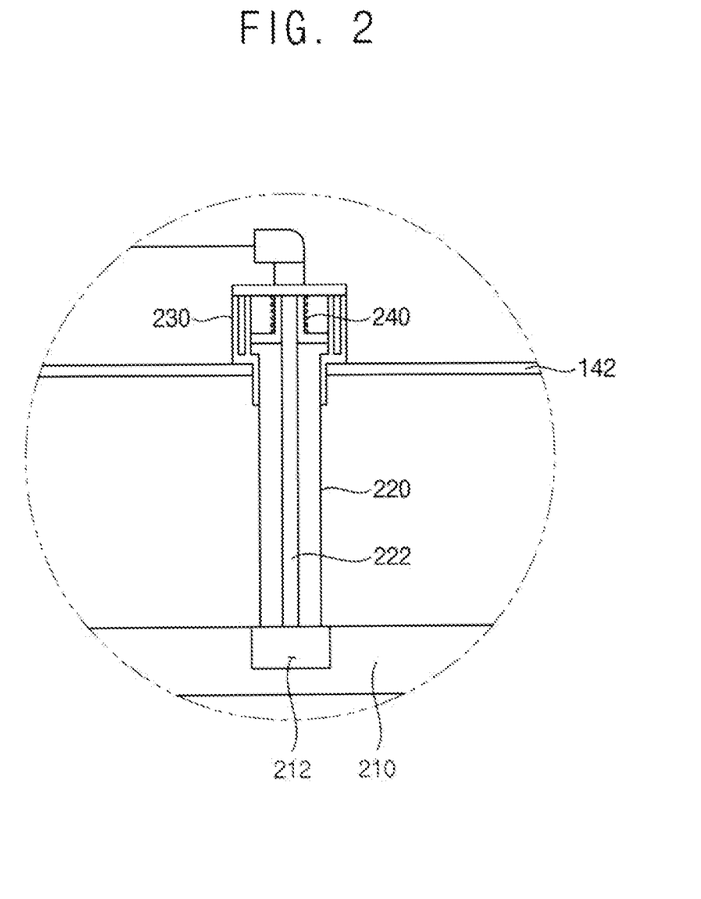
FIG. 2 illustrates an enlarged cross-sectional view of a temperature controller of the plasma processing apparatus in FIG. 1.
Figure 3:
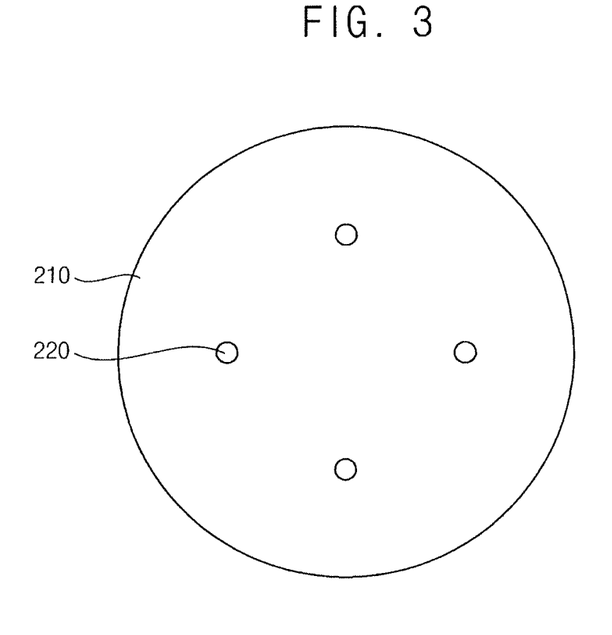
FIG. 3 illustrates a plan view of the temperature controller in FIG. 2.
Figure 4:
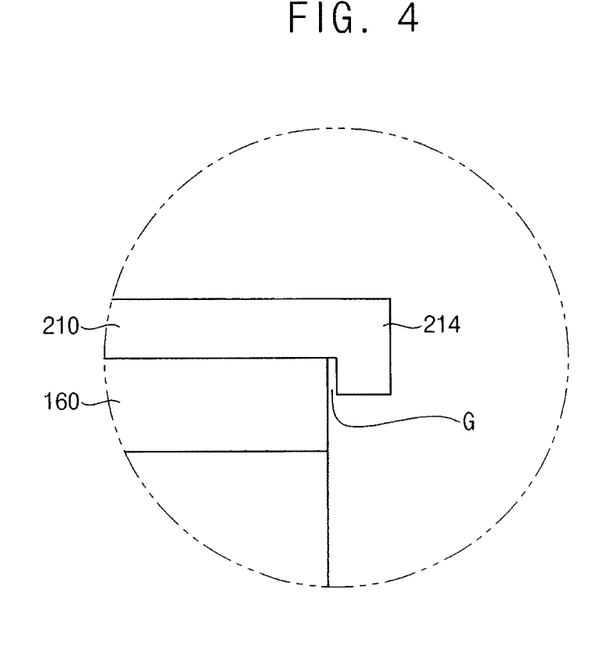
FIG. 4 illustrates an enlarged cross-sectional view of a cooling plate and a dielectric window of the plasma processing apparatus in FIG. 1.

FIG. 2 illustrates an enlarged cross-sectional view of a temperature controller of the plasma processing apparatus in FIG. 1, FIG. 3 illustrates a plan view of the temperature controller in FIG. 2, and FIG. 4 illustrates an enlarged cross-sectional view illustrating a cooling plate and a dielectric window of the plasma processing apparatus in FIG. 1.

Referring to FIGS. 2 to 4, the temperature controller 200 may control a temperature of the dielectric window 160 using a cooling agent or coolant. The cooling agent may include a gas or a liquid. The temperature controller 200 may include a cooling plate 210, a cooling port 220, a cap 230, and a resilient member 240.

The cooling plate 210 may movably make contact with the dielectric window 160 in a horizontal direction and a vertical direction (e.g., the cooling plate 210 may be selectively movable to be brought into contact with the dielectric window 160 or to be spaced apart from the dielectric window 160). The cooling plate 210 may make contact with an upper surface of the dielectric window 160. The cooling plate 210 may include a material different from that of the dielectric window 160. For example, the cooling plate 210 may include polyetheretherketone (PEEK). For example, the cooling plate 210 may have a thermal expansion coefficient different from that of the dielectric window 160.

Therefore, during a plasma process that is performed in the plasma chamber 110, expanded lengths of the cooling plate 210 in the horizontal direction and the vertical direction caused by the plasma may be different from those of the dielectric window 160. If the cooling plate 210 were to be fixed to the dielectric window 160 to prevent movement of the cooling plate 210 in the horizontal and vertical directions, the cooling plate 210 (being weaker than the dielectric window 160) could be damaged.

In order to help prevent damage to the cooling plate 210 that could otherwise be caused by the horizontal thermal expansion, the cooling plate 210 may include a supporting portion or support 214. The support 214 may be downwardly extended from an outer edge of a lower surface of the cooling plate 210. For example, the support 214 may surround a side surface of the dielectric window 160. In an implementation, a gap G may be formed or be present between the support 214 and the dielectric window 160. The cooling plate 210 and the dielectric window 160 may be thermally expanded along the horizontal direction in the gap G. A width of the gap G may be determined or selected in accordance with the thermal expansion coefficients of the cooling plate 210 and the dielectric window 160.

The cooling plate 210 may include at least one cooling groove 212 into which the cooling agent may be introduced. The cooling groove 212 may be, e.g., vertically, formed from the upper surface of the cooling plate 210. In an implementation, the cooling groove 212 may include four grooves spaced apart from each other by a uniform gap. In an implementation, the cooling groove 212 may include two grooves, three grooves, or at least five grooves.

The cooling port 220 may be arranged over or aligned with each of the cooling grooves 212. The cooling port 220 may be fixed to the antenna ground plate 142. The cooling port 220 may include a cooling passageway 222 into and/or through which the cooling agent may be introduced. The cooling passageway 222 may be vertically formed in the cooling port 220. A lower end of the cooling passageway 222 may be connected, open to, or in fluid communication with the cooling groove 212. For example, the cooling agent may be introduced into the cooling groove 212 through the cooling passageway 222 to cool the dielectric window 160.

An upper end of the cooling passageway 222 may be connected with a chiller 250 through a main duct 260. The cooling agent generated or provided from the chiller 250 may flow into the cooling passageway 222 through the main duct 260. In an implementation, a heater 270 for selectively heating the cooling agent may be installed on the main duct 260.

Figure 7:
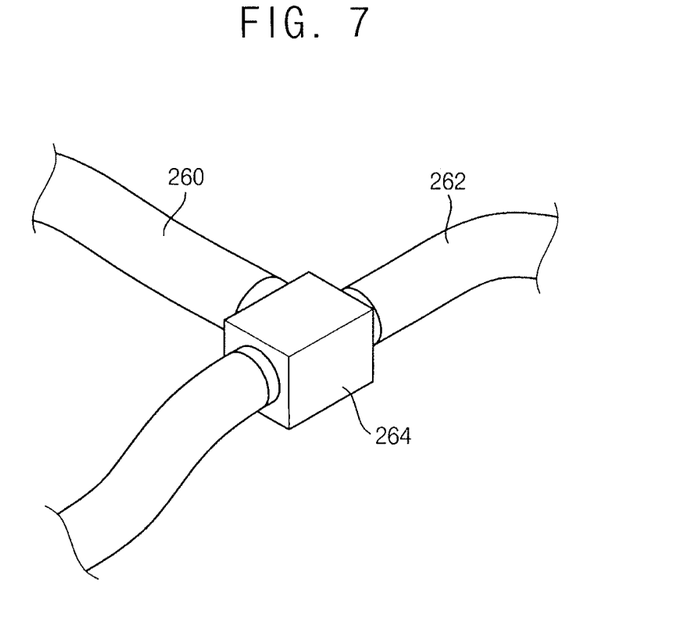
FIG. 7 illustrates a perspective view of ducts of the plasma processing apparatus in FIG. 1.
Figure 8:
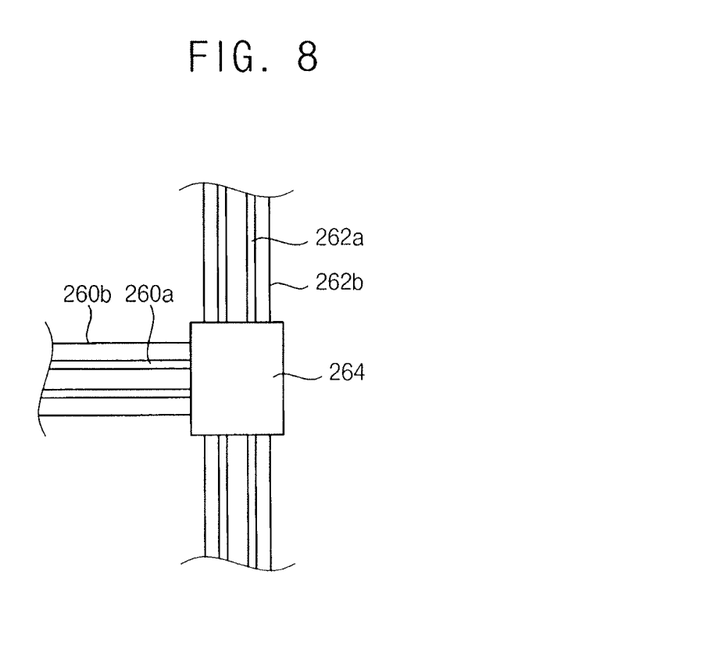
FIG. 8 illustrates an enlarged cross-sectional view of the ducts in FIG. 7.

FIG. 7 illustrates a perspective view of ducts of the plasma processing apparatus in FIG. 1, and FIG. 8 illustrates an enlarged cross-sectional view of the ducts in FIG. 7.

Referring to FIGS. 7 and 8, the cooling port 220 may include a plurality of ports, and the main duct 260 (extended from the chiller 260) may be connected to a plurality of branch ducts 262. The main duct 260 and the branch ducts 262 may include a plastic.

In order to reduce heat loss of the cooling agent in the main duct 260 and the branch ducts 262, the main duct 260 may have a double pipe shape including an inner pipe 260a and an adiabatic or insulating pipe 260b surrounding the inner pipe 260a. In an implementation, each of the branch ducts 262 may have a double pipe shape including an inner pipe 262a and an adiabatic or insulating pipe 262b surrounding the inner pipe 262a.

The main duct 260 may be connected to the branch ducts 262 with a fitting 264. The fitting 264 may include a material substantially the same as that of the main and branch ducts 260 and 262. For example, the fitting 264 may include the plastic. In an implementation, the fitting 264 may be fixed to the main duct 260 and the branch ducts 262 by a thermal doubling or coupling.

Referring to FIGS. 2 to 4, in order to prevent damage to the cooling plate 210 due to vertical thermal expansion, the resilient member 240 may resiliently support the cooling port 220 in a downward direction. For example, the resilient member 240 may be downwardly elastically biased to resiliently support or press the cooling port 220 toward the cooling plate 210. The resilient member 240 may be arranged at an upper end of the cooling port 220. The resilient member 240 may be installed at the cap 230 that covers the cooling port 220. In an implementation, the resilient member 240 may include a spring or elastic.

For example, the cooling plate 210 may be moved in the vertical direction and such movement may be compensated for by the resilient member 240. For example, the resilient member 240 may allow or facilitate the vertical movement of the cooling plate 210 with respect to the dielectric window 160. For example, vertical thermal expansion of the cooling plate 210 may be not restricted so that the cooling plate 210 may not be damaged.

Figure 5:
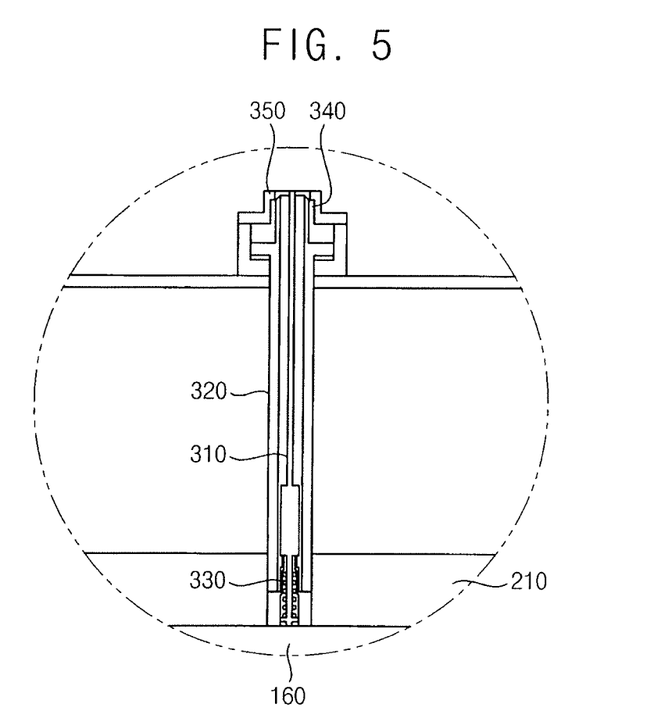
FIG. 5 illustrates an enlarged cross-sectional view of a temperature measurer of the plasma processing apparatus in FIG. 1.
Figure 6:
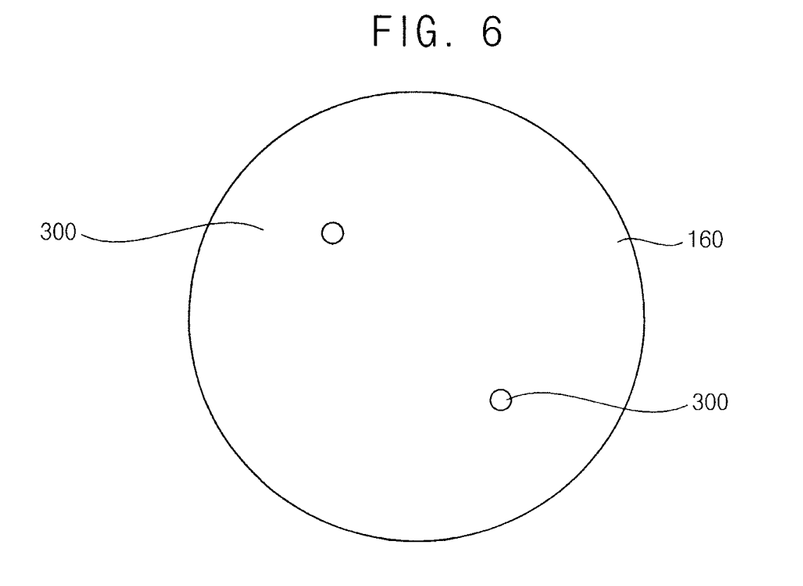
FIG. 6 illustrates a plan view of the temperature measurer in FIG. 5.

FIG. 5 illustrates an enlarged cross-sectional view of a temperature measurer of the plasma processing apparatus in FIG. 1, and FIG. 6 illustrates a plan view of the temperature measurer in FIG. 5.

Referring to FIGS. 5 and 6, the temperature measurer 300 may measure a temperature of the dielectric window 160. The temperature measurer 300 may include a thermocouple 310, a housing 320, a cap 350, a first spring 330, and a second spring 340.

The thermocouple 310 may be arranged over the dielectric window 160. A lower end of the thermocouple 310 may make contact with the upper surface of the dielectric window 160 through the cooling plate 210. In an implementation, the thermocouple 310 may include two elements spaced apart from each other by a uniform gap. In an implementation, the thermocouple 310 may include one element or at least three elements.

The temperature of the dielectric window 160 measured by the thermocouple 310 may be transmitted to the heater 270. The heater 270 may selectively heat the cooling agent in accordance with the temperature of the dielectric window 160.

The housing 320 may surround the thermocouple 310. For example, the housing 320 may have a hollow cylindrical shape. The housing 320 may be fixed to the antenna ground plate 142. The housing 320 may prevent direct contact between the thermocouple 310 and the cooling agent. For example, the housing 320 may prevent or minimize a heat exchange between the thermocouple 310 and the cooling agent. For example, the housing 320 may include an adiabatic or insulating material for reducing the heat exchange.

The first spring 330 may be on a lower portion of an inner surface of the housing 320 (e.g., proximate to the dielectric window 160). The first spring 330 may resiliently support or press the thermocouple 310 toward the dielectric window 160. Thus, contact between the lower end of the thermocouple 310 and the upper surface of the dielectric window 160 may be guaranteed or facilitated by the first spring 330. For example, in order to contact the thermocouple 310 with the dielectric window 160, it may not be required to form a groove at the dielectric window 160.

The second spring 340 may be arranged on an inner surface of the cap 350 covering the housing 320. The second spring 340 may resiliently support or press the housing 320 toward the dielectric window 160. For example, contact between the lower end of the housing 320 and the upper surface of the dielectric window 160 may be guaranteed or facilitated by the second spring 340. As a result, the cooling agent may not infiltrate into the housing 320, e.g., due to the pressing and sealing action of the second spring 340.

As mentioned above, the contact between the thermocouple 310 and the dielectric window 160 may be facilitated by the first spring 330. The thermocouple 310 may not directly make contact with the cooling agent, due to the housing 320 and the second spring 340. For example, the thermocouple 310 may accurately measure the temperature of the dielectric window 160.

By way of summation and review, in order to increase efficiency of the plasma processing apparatus, a temperature control of the dielectric window may be considered.

A cooling plate may be arranged on the dielectric window. A cooling agent may be introduced into the cooling plate. The cooling plate may have a thermal expansion coefficient that is different from that of the dielectric window. If the cooling plate were to be fixed to the dielectric window, the cooling plate could be damaged due to the different thermal expansion coefficients.

Further, a thermocouple for measuring the temperature of the dielectric window may be inserted into a groove formed at the dielectric window. The groove may decrease strength of the dielectric window. The RF power may be concentrated on the groove. For example, the cooling agent introduced through the groove may make contact with the thermocouple so that the thermocouple may not accurately measure the temperature of the dielectric window.

The embodiments may provide a temperature controller for controlling the temperature of a dielectric window of a plasma processing apparatus, a temperature measurer for measuring the temperature of the dielectric window, and a plasma processing apparatus including the temperature controller and the temperature measurer.

The embodiments may provide a temperature controller for a plasma processing apparatus that may be capable of preventing damage to a cooling plate.

The embodiments may provide a temperature measurer for a plasma processing apparatus that may be capable of accurately measuring a temperature of the dielectric window.

According to example embodiments, the resilient member may resiliently support the cooling port toward the cooling plate so that the cooling plate may be thermally expanded with the resilient member being compressed. Thus, the thermal expansion of the cooling plate may occur while still prevent damage to the cooling plate. Further, the housing may surround the thermocouple so that the thermocouple may not directly make contact with the cooling agent. Therefore, the thermocouple may accurately measure the temperature of the dielectric window.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A temperature controller for a plasma processing apparatus, the temperature controller comprising:
    a movable cooling plate configured to selectively contact a dielectric window in a plasma chamber, the cooling plate having at least one cooling groove through which a cooling agent for cooling the dielectric window is flowable;
    at least one cooling port including a cooling passageway that is connected to the at least one cooling groove;
    a resilient member that is elastically biased toward the cooling plate to resiliently press the cooling port toward the cooling plate such that the cooling plate is relatively movable with respect to the dielectric window; and
    a temperature measurer configured to measure a temperature of the dielectric window,
    wherein the temperature measurer includes:
    a thermocouple configured to selectively contact the dielectric window and to measure the temperature of the dielectric window,
    a housing surrounding the thermocouple and preventing contact between the thermocouple and the cooling agent,
    a first spring configured to resiliently press the thermocouple toward the dielectric window; and a second spring configured to resiliently press the housing toward the dielectric window.

2. The temperature controller as claimed in claim 1, wherein the cooling plate is configured to selectively contact an upper surface of the dielectric window.

3. The temperature controller as claimed in claim 2, wherein the cooling plate includes a support surrounding a side surface of the dielectric window, such that a gap is present between the side surface of the dielectric window and the support.

4. The temperature controller as claimed in claim 1, wherein the at least one cooling groove includes a plurality of grooves spaced apart from each other by a uniform gap.

5. The temperature controller as claimed in claim 1, further comprising a cap covering the cooling port, wherein the resilient member is fixed to the cap.

6. The temperature controller as claimed in claim 1, wherein:
the cooling port is arranged over the cooling plate, and
the cooling port is fixed to an antenna ground plate.

7. The temperature controller as claimed in claim 1, further comprising a heater configured to selectively heat the cooling agent in accordance with the temperature of the dielectric window measured by the temperature measurer.

8. The temperature controller as claimed in claim 7, wherein the heater and the cooling passageway are connected with each other via a double pipe.

9. A plasma processing apparatus, comprising:
a plasma chamber;
a chuck in the plasma chamber and on which a substrate is receivable;
an antenna at an upper region in the plasma chamber, the antenna being configured to induce an electromagnetic field between the chuck and the antenna;
a dielectric window between the antenna and the chuck;
a movable cooling plate configured to selectively contact the dielectric window, the cooling plate having at least one cooling groove through which a cooling agent for cooling the dielectric window is flowable;
at least one cooling port including a cooling passageway that is connected to the at least one cooling groove; and
a resilient member that is elastically biased toward the cooling plate to resiliently press the cooling port toward the cooling plate such that the cooling plate is relatively movable with respect to the dielectric window;
a thermocouple configured to selectively contact a dielectric window in a plasma chamber and to measure the temperature of the dielectric window;
a housing surrounding the thermocouple and preventing contact between the thermocouple and the cooling agent;
a first spring configured to resiliently press the thermocouple toward the dielectric window; and
a second spring configured to resiliently press the housing toward the dielectric window.

10. The plasma processing apparatus as claimed in claim 9, wherein the cooling plate includes a support surrounding a side surface of the dielectric window, such that a gap is present between the side surface of the dielectric window and the support.

11. The plasma processing apparatus as claimed in claim 9, further comprising a heater configured to selectively heat the cooling agent in accordance with the temperature of the dielectric window measured by the thermocouple.

12. The plasma processing apparatus as claimed in claim 9, further comprising a heater in the chuck.

* * * * *